United States Patent [19]
Chu et al.

[11] Patent Number: 6,127,866
[45] Date of Patent: Oct. 3, 2000

[54] DELAY-LOCKED-LOOP (DLL) HAVING SYMMETRICAL RISING AND FALLING CLOCK EDGE TYPE DELAYS

[75] Inventors: Albert M. Chu, Essex; John A. Fifield, Underhill, both of Vt.; Jason E. Rotella, Witherbee, N.Y.; Jean-Marc Dortu, Munich, Germany

[73] Assignees: Infineon Technologies North America Corp., San Jose, Calif.; International Business Machines Corporation, Armonk, N.Y.

[21] Appl. No.: 09/239,487

[22] Filed: Jan. 28, 1999

[51] Int. Cl.[7] ...................................................... H03L 7/06
[52] U.S. Cl. ........................ 327/158; 327/156; 327/149; 327/147; 327/237
[58] Field of Search ..................................... 327/263, 244, 327/147, 149, 153, 156, 158, 161, 270, 237

[56] References Cited

U.S. PATENT DOCUMENTS 5,883,534  3/1999  Kondoh et al. ......................... 327/156

*Primary Examiner*—Dinh T. Le
*Attorney, Agent, or Firm*—Stanton C. Braden

[57] ABSTRACT

A circuit and method are provided wherein a receiver receives an input train of pulses. The circuit includes a delay-locked-loop coupled to an output of the receiver. The delay-locked-loop includes a pulse generator responsive to received input train of pulses produced at the output of the receiver for producing first pulses in response to the leading edges of the received input train of pulses and second pulses in response to the trailing edges of received input train of pulses. The leading edge of the first pulse has the same edge type as the leading edge of the second pulse (i.e., the leading edge of the first pulse and the leading edge of the second pulse are either both rising edge types or both falling edges types). The first pulses and the second pulses are combined into a composite input signal comprising the first and second pulses with the leading edge of the first pulse maintaining the same edge type. The delay-locked-loop also includes a variable delay line fed by the composite input signal for producing a composite output train of pulses comprising both the first train of pulses and the second train of pulses after a selected time delay provided by the delay line. The delay-locked-loop is responsive to one of the first train of pulses and the second train of pulses in the composite output train of pulses for selecting the time delay of the variable delay line so as to produce the composite output train of pulses with a predetermined phase relationship to the input train of pulses.

14 Claims, 3 Drawing Sheets

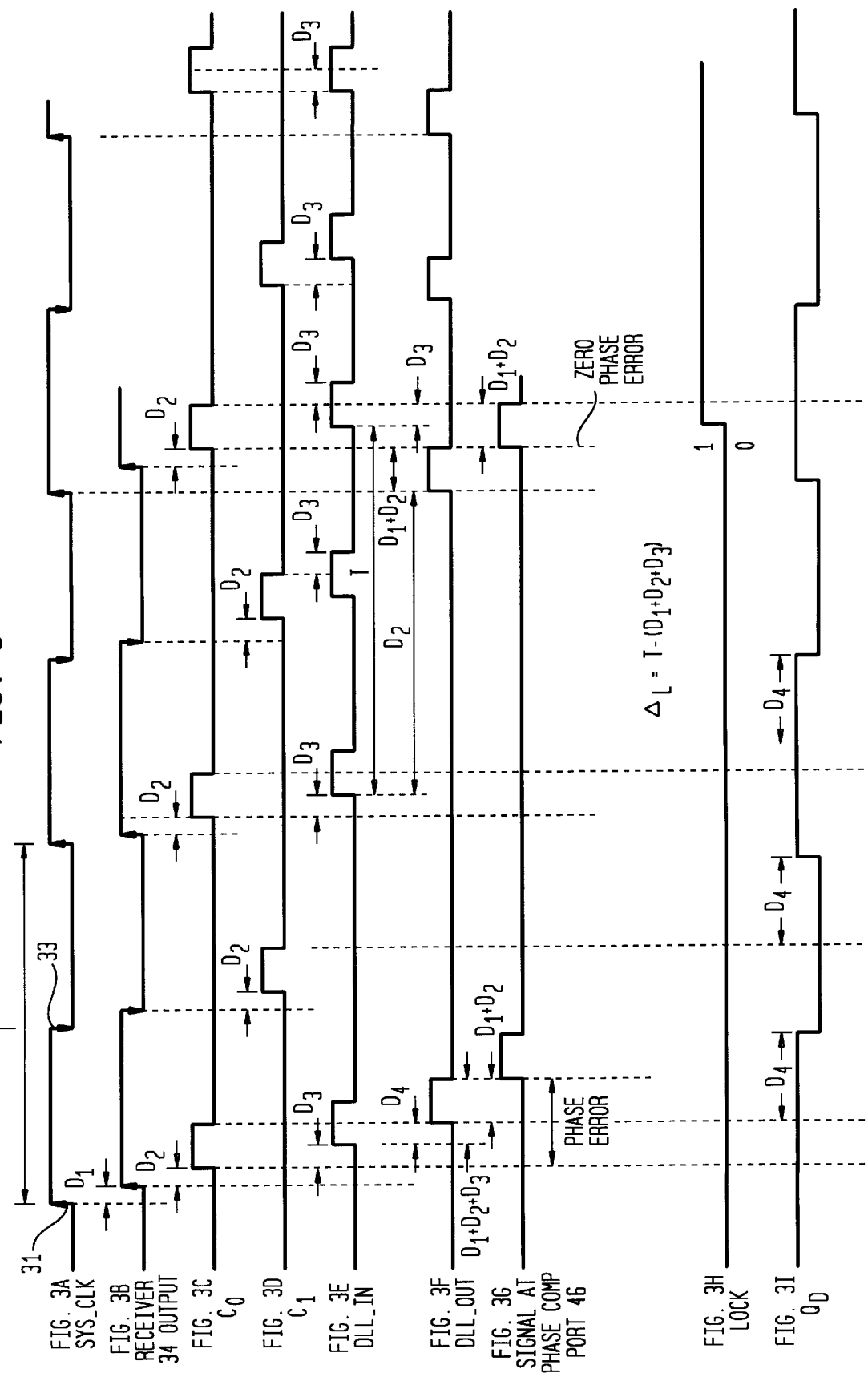

DELAY-LOCKED-LOOP (DLL) HAVING SYMMETRICAL RISING AND FALLING CLOCK EDGE TYPE DELAYS

BACKGROUND OF THE INVENTION

This invention relates generally to delay-locked-loops.

As is known in the art, delay-locked-loops are used in a wide variety of applications in order to produce an output signal in-phase with a received signal, such as a train of input pulses. One such application is shown in FIG. 1 where an input train of pulses, such as system clock pulses, SYS_CLK, are received by a receiver 12 (i.e., buffer) of an integrated circuit chip. The receiver 12 imparts a finite time delay, $\Delta$, to the received pulses. In order to produce an output train of pulses in phase alignment with the input clock pulses (i.e., in order to maintain a predetermined phase relationship between the output train of pulses and the input clock pulses), a delay-locked-loop (DLL) 14 is sometimes provided. The delay-locked-loop 14 includes a phase comparator 16, a variable, typically digitally controlled, delay line 18, and a fixed delay 20. The fixed delay 20 has the same delay, $\Delta$, as the receiver 12. The output of the receiver 12 (i.e., input to the DLL 14) is fed to one input 22 of the phase comparator 16 and the output of the DLL 14 is fed to another input 24 of the phase comparator 16. In the steady-state, the output of the phase comparator 16 will force the time delay of the digitally controlled delay line 18 to a time delay $nT-\Delta$, where T is the period of the clock pulses fed to the receiver 12 and n is an integer. That is, the output of the variable delay line 18 is feedback to input 24 of the phase comparator 16. The output of the phase comparator is a phase error signal. The phase error signal drives the delay of the delay line 18 such that the error is driven to zero. Thus, in the steady-state, (i.e, when the phase error is driven to zero) the total time delay through the receiver 12 and the delay line 18 is $\Delta+(nT-\Delta)=nT$. That is, the train of pulses produced at the output of the digitally controlled delay line 18 (i.e., the output of the DLL) will, in the steady-state, be in-phase, or time-aligned (i.e., timed coincident) with the train of SYS_CLK clock pulses received by the receiver 12. As is known each pulse has a leading edge followed by a trailing edge. These edges are of different edge types, i.e., the leading edge may be a rising edge type in which case the trailing edge will be a falling edge type; or, on the other hand, the leading edge may be a falling edge type in which case the trailing edge will be a rising edge type.

As is also known in the art, some digital devices operate in response to both leading and trailing edges of the clock pulses. For example, Double-Data-Rate Synchronous Dynamic Random Access Memories (DDR-SDRAMs), require timing specifications to both the leading and trailing edges of clock pulses fed to such DDR-SDRAMs. More particularly, when system clock pulses are fed to the DDR-SDRAM chip, the pulses are received by a receiver on the chip. The receiver provides a time delay to the clock pulses. To compensate for this time delay, a DLL is sometimes used. As noted above, the DLL may include a digitally controlled delay line. One such delay line includes both n-channel field effect transistors (NFETs) and p-channel field effect transistors (PFETs). Due to processing variations, the amount of current the PFET can source relative to the NFET varies thereby causing skew between propagation of rising and falling edge types in a PFET/NFET delay line (i.e., the rise delay of a clock pulse is different from the fall delay of the clock pulse). This introduces "jitter" in a DLL system and detracts from maximum operating objective data rate, for example, a data rate of 200 MHz. For a typical delay line length of 5 nanoseconds (ns) for a 100 MHz clock, such processing variation effects can modulate rising and falling delays by approximately 0.5 ns.

SUMMARY OF THE INVENTION

In accordance with the present invention, a circuit is provided having: a receiver for receiving an input train of pulses and a delay-locked-loop coupled to an output of the receiver. The delay-locked-loop includes a pulse generator responsive to received input train of pulses produced at the output of the receiver for producing first pulses in response to the leading edges of the received input train of pulses and second pulses in response to the trailing edges of received input train of pulses. The leading edge of the first pulse has the same edge type as the leading edge of the second pulse (i.e., the leading edge of the first pulse and the leading edge of the second pulse are either both rising edge types or both falling edges types). The first pulses and the second pulses are combined into a composite input signal comprising the first and second pulses with the leading edge of the first pulse maintaining the same edge type. The delay-locked-loop also includes a variable delay line fed by the composite input signal for producing a composite output train of pulses comprising both the first train of pulses and the second train of pulses after a selected time delay provided by the delay line. The delay-locked-loop is responsive to one of the first train of pulses and the second train of pulses in the composite output train of pulses for selecting the time delay of the variable delay line so as to produce the composite output train of pulses with a predetermined phase relationship to the input train of pulses.

With such an arrangement, both the leading edge and trailing edge of each of the received input pulses is represented by a pulse having the same leading edge type (i.e., the leading edge of the first pulse and the leading edge of the second pulse are both the same edge type; i.e., either both rising edge types or both falling edge types). Therefore, using the delay-locked-loop to operate in response to one of the first output pulses (i.e., pulses associated with the leading edge of the input train of pulses) or second output pulses (i.e., pulses associated with the trailing edge of the input train of pulses) assures proper phase alignment of both the leading and trailing edges of the input train of pulses. To put it another way, the delay-locked-loop operates with the same edge type since such edge type is produced in response to both the leading and trailing edges of the received train of pulses. Thus, because the delay characteristics of the delay line is the same for both leading and trailing edges of the input train of pulses, the output train of pulses is in proper time alignment with the input train of pulses.

In accordance with another embodiment of the invention, the delay-locked-loop includes a phase comparator for producing a control signal for the variable delay line in response to a time difference between pulses in the output train of pulses and pulses in the received train of input pulses.

In accordance with another embodiment of the invention, the delay-locked-loop includes a logic network for enabling only one of the first and second pulses to pass from the receiver to the delay line until the phase comparator provides an indication that the output train of pulses have rising edge types timed coincident with both the rising and falling edge types of the input train of pulses.

In accordance with another embodiment of the invention, the phase comparator includes a first input fed by pulses in the output train of pulses and a second input fed by pulses in the received train of input pulses. The delay-locked-loop includes: a gate fed by the output train of pulses and a gating signal; and a gate pulse generator responsive to one of the first and second pulses for producing the gating signal during the first pulse to enable the output train of pulses to pass through such gate to the phase comparator and to inhibit the output train of pulses from passing through the gate to the phase comparator during the second pulse.

In accordance with another embodiment of the invention, a method is provided for generating a train of output pulses time having a predetermined time relationship with a train of input pulses. The method includes passing the input train of pulses through a receiver and producing a corresponding output train of pulses having leading and trailing edges timed coincident with both the leading and trailing edges of the input train of pulses.

In accordance with one embodiment, the producing step comprises: producing a first pulse in response to the leading edge of each one of the received input train of pulses and a second pulse in response to the trailing edge of each one of the received input train of clock pulses; and, feeding the first and second pulses through a delay line of a delay-locked-loop to produce at an output of the delay line the output train of pulses.

In accordance with another embodiment, the producing step includes producing a control signal for the variable delay line in response to a time difference between pulses in the output train of pulses and pulses in the received train of input pulses.

In accordance with another embodiment, the producing step comprises enabling only one of the first and second pulses to pass from the receiver to the delay line until an indication is provided that the output train of pulses have leading and trailing edges timed coincident with both the leading and trailing edges of the input train of pulses.

BRIEF DESCRIPTION OF THE DRAWING

Other features of the invention, as well as the invention itself, will become more readily apparent from following detailed description when taken together with the accompanying drawings, in which:

FIGS. 3A–3I are timing diagrams of signals produced in the circuit of FIG. 2.

DETAILED DESCRIPTION

Figure 1:
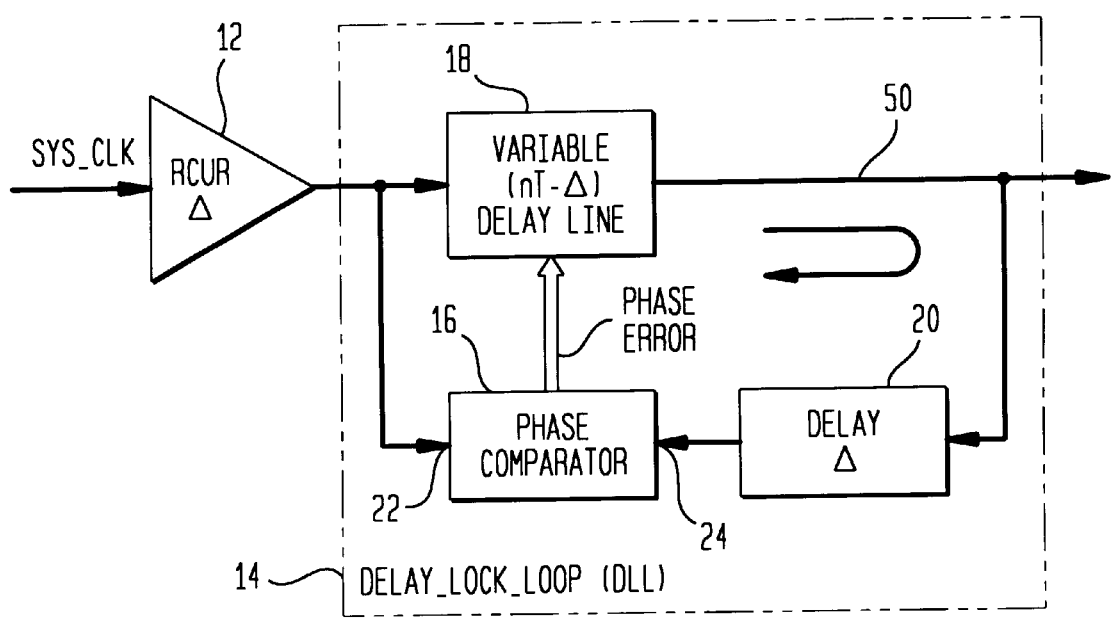
FIG. 1 is a block diagram of a circuit having a delay-locked-loop according to the PRIOR ART.
Figure 2:
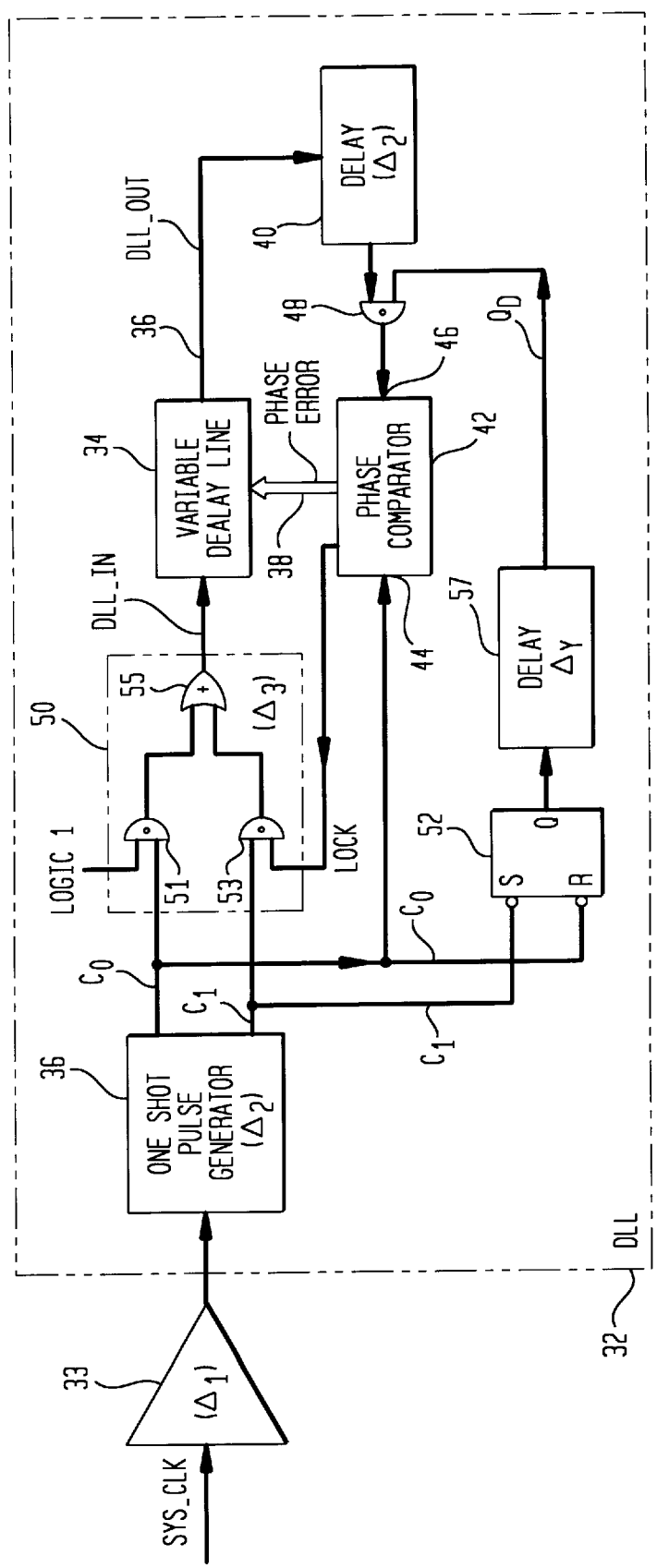
FIG. 2 is a block diagram of a circuit having a delay-locked-loop according to the invention.

Referring now to FIG. 2, a circuit 30 is shown for receiving an input train of pulses, here system clock pulses, SYS_CLK (FIG. 3A). Each one of the pulses has a leading edge 31, here a rising edge type and a trailing edge 33, here a falling edge type, as shown in FIG. 3A. The circuit includes a delay-locked-loop (DLL) 32. The DLL 32 is responsive to both leading and trailing edges of the received input train of pulses and produces a corresponding output train of pulses DLL_OUT (FIG. 3F) having both leading and trailing edges with a predetermined phase alignment, here timed coincident, with both the leading and trailing edges of the input train of pulses SYS_CLK.

More particularly, the circuit 30 includes a receiver 33, typically a buffer amplifier, for receiving the input train of pulses SYS_CLK. The input train of pulses SYS_CLK has a period, T, as indicated in FIG. 3A. The receiver 33 provides a first time delay, $\Delta_1$ to the pulses in the input train of pulses SYS_CLK, as indicated in FIG. 3B.

The DLL 32 includes a pulse generating circuit 36, here a pair of one-shot multivibrators, for example, coupled to an output of the receiver 32. The one-shot multivibrators 36 produce a first pulse on line C0 (FIG. 3C), having a time duration less than T/2, in response to the leading edge of each one of the pulses in the input train of pulses and a second pulse on line C1 (FIG. 3D) in response to the trailing edge of each one of the pulses in the input train of pulses. Each one of the first pulses and each one of the second pulses have the same leading edge type; here, in this example, each one of the first pulses and each one of the second pulses have a rising edge type. The first and second pulses on lines C0 and C1 are shown in FIGS. 3C and 3D, respectively. The pulse generating circuit 36 produces the first pulses with a second time delay $\Delta_2$ after the leading edge of the pulses produced at the output of receiver 33 and the second pulses with the second time delay $\Delta_2$ after the leading edge of the pulses produced at the output of receiver 33.

Also provided in the DLL 32 is a logic network 50 fed by the pulses produced at the output of one shot pulse generator 36 and a variable, here digitally controlled, delay line 34, fed by the signal DLL_IN produced at the output of logic network 50. The logic network 50 includes a pair of AND gates 51, 53 fed by the pulses on lines C0 and C1, respectively, as shown. AND gate 51 is fed with a logic 1 signal. AND gate 53 is fed with a LOCK signal (FIG. 3H). The outputs of the AND gates 51, 53 are fed to inputs of an OR gate 55, as indicated. The logic network 50 enables only one of the first and second pulses, here only the first pulses on line C0, to pass from the pulse generator 36 to the delay line 34 during a start-up mode (i.e., until the phase comparator 42 provides an indication on line LOCK that the output train of pulses DLL_OUT have leading and trailing edges timed coincident with both the leading and trailing edges of the input train of pulses SYS_CLK fed to the receiver 33. During the normal operating mode, after the star-up mode when a LOCK signal is produced, the logic network 50 produces a composite output signal comprising the first pulses on line C0 and the second pulses on line C1, i.e., the signal DLL_IN as shown in FIG. 3E. It is noted that the logic network 50 provides a delay $\Delta_3$ to the first and second pulses fed thereto on lines C0 and C1, respectively. To put it another way, in order to safe guard the circuit from mislocking onto the pulses on line C1 instead of the pulses on line C0, the gate 48 is used to gate "off" (i.e., inhibit) the pulses on line C1 until the DLL 32 is locked; i.e., when the "LOCK" signal goes to logic 1 as shown in FIG. 3H.

As indicated above, the DLL 32 includes the variable, here digitally controlled, delay line 34. The variable delay line 34 is responsive to the first and second pulses and produces corresponding first and second output pulses on output 36. Each one of such first output pulse on line 36, which is a pulse having a rising leading edge produced in response to the rising edge of each pulse produced at the output of receiver 33, is produced in response to the corresponding one of the first pulses after a time delay $\Delta_L$ selected in accordance with a control signal fed to the variable delay line 36 on line 38, in a manner to be described. The signal on line 38 is a phase error. In like manner, each one of such second output pulse on line 36, which is a pulse having a rising leading edge produced in response to the trailing edge of each pulse produced at the output of receiver 33, is produced in response to the corresponding one of the second pulses after the same time delay $\Delta_L$ selected in accordance with a control signal fed to the variable delay line 36 on line

38, in a manner to be described. That is, because the leading edges of both the first pulse on line C0 and second pulse on line C1 have the same edge types, here rising edge type, the delay line will produce the same delay $\Delta_L$ to both the first pulse and the second pulse. The output of the variable delay line 34 produces the train of output pulses DLL_OUT on line 36, as indicated.

The DLL 34 includes a delay network 40 fed by the output train of pulses DLL_OUT on line 36. The delay network 40 provides a time delay $\Delta_4$ here equal to $\Delta_1+\Delta_2$ (FIG. 3G). Also provided in the DLL 32 is a phase comparator 42 having a first input 44 fed by one of the first and second pulses, here the first pulses on line C0 and a second input 46 coupled to an output of the delay network 46 through an AND gate 48, for producing the control signal on line 38. In the steady-state phase of the start-up mode, i.e., when the error signal on line 38 is driven to zero, the control signal on line 38 selects the time delay $\Delta_3$ equal to nT, where n is an integer, for the variable delay line 34 to produce the output pulses DLL_OUT on line 36 having leading edges and trailing edges timed coincident with the leading edges and trailing edges, respectively, of the pulses in the input train of pulses SYS_CLK fed to the receiver 33. At this time, the LOCK signal is produced and the DLL 32 maintains this time coincident relationship.

As noted above, the logic network 50 enables only one of the first and second pulses, here only the first pulses on line C0, to pass from the receiver 33 to the delay line 34 until the phase comparator 42 provides an indication on line LOCK that the output train of pulses DLL_OUT delayed $\Delta_1+\Delta_2$ fed thereto have leading and trailing edges timed coincident with the leading and trailing edges of the input train of pulses SYS_CLK fed to the receiver 33. The DLL gate 48 is fed by a time delayed version of the output train of pulses on line 36 and a time delayed gating signal produced by a gate pulse generator 52. Here, the gate pulse generator 52 is a latch having an inverted set S input coupled to line C1 and an inverted reset input R coupled to line C0. The output of the gate pulse generator 52, Q, is fed through a fixed delay line 57 (here providing a delay $\Delta_4$ to Q to provide a delayed pulse $Q_D$) to an input of AND gate 48. The gate generator 52 is responsive to one of the first and second pulses and produces the gating signal on line Q. The signal on line Q is delayed by delay 57 to produce a delayed gating signal $Q_D$, shown in FIG. 3I, which is used during the first pulse to enable the output train of pulses to pass through such AND gate 48 to the phase comparator 42 and to inhibit the output train of pulses from passing through the AND gate 48 to the phase comparator 42 during the second pulse. That is, to ensure that only the pulse on line C0 is phase compared with the SYS_CLK, a SET-RESET latch (i.e., gate generator 52) is used to gate the feedback from the delay line 34. The gate generator 52 is RESET with the falling edge of the pulses on line C0 and SET with the falling edge of the pulses on line C1.

Other embodiments are within the spirit and scope of the appended claims. For example, while the one shot pulse generator 36 produces pulses having rising leading edges, such generator 36 may produce pulses having falling leading edges. Further, while a leading edge time coincidence criteria has been used a trailing edge time coincidence may be used and is an equivalent so long as both the first pulses and the second pulses have the same type edges (i.e., either a rising edge or a falling edge). That is, a first pulse produced in response to the trailing edge of the receiver output with the second pulse produced in response to the leading edge of the receiver output is equivalent to the circuit in FIG. 2 as long as both the first pulse and the second pulse have the same edge type (i.e., both rising or both falling). Still further, while time coincidence has been used (i.e., a zero phase difference being the leading edges of the SYS_CLK and the leading edges of the output pulses DLL_OUT), a fixed, non-zero phase difference may be used.

What is claimed is:

1. A circuit, comprising:
    a receiver for receiving an input train of pulses; and
    a delay-locked-loop coupled to an output of the receiver, the delay-locked-loop comprising:
        a pulse generator responsive to the received input train of pulses produced at the output of the receiver for producing first pulses in response to leading edges of the received input train of pulses and second pulses in response to trailing edges of the received input train of pulses, the leading edges of the first pulses having the same edge type as the leading edges of the second pulses;
        a logic network for combining the first pulses and the second pulses into a composite input signal comprising the first and second pulses with the leading edges of the first pulses maintaining the same edge type;
        a variable delay line fed by the composite input signal for producing a composite output train of pulses comprising both the first train of pulses and the second train of pulses after a time delay
        selected in accordance with the first pulses, second pulses and one of the first train of pulses and the second train of pulses in the composite output train of pulses.

2. The circuit recited in claim 1 wherein the delay-locked-loop includes a phase comparator for producing a control signal for the variable delay line in response to a time difference between pulses in the output train of pulses and pulses in the received train of input pulses.

3. The circuit recited in claim 2 wherein the delay-locked-loop includes a logic network for enabling only one of the first and second pulses to pass from the receiver to the delay line until the phase comparator provides an indication that the output train of pulses have rising edge types timed coincident with both the rising and falling edge types of the input train of pulses.

4. The circuit recited in claim 3 wherein the phase comparator includes a first input fed by pulses in the output train of pulses and a second input fed by pulses in the received train of input pulses and
    wherein the delay-locked-loop includes:
        a gate fed by the output train of pulses and a gating signal; and
        a gate pulse generator responsive to one of the first and second pulses for producing the gating signal during the first pulse to enable the output train of pulses to pass through said gate to the phase comparator and to inhibit the output train of pulses from passing through the gate to the phase comparator during the second pulse.

5. The circuit recited in claim 2 wherein the phase comparator includes a first input fed by pulses in the output train of pulses and a second input fed by pulses in the received train of input pulses and
    wherein the delay-locked-loop includes:
        a gate fed by the output train of pulses and a gating signal; and
        a gate pulse generator responsive to one of the first and second pulses for producing the gating signal during the first pulse to enable the output train of pulses to pass through said gate to the phase comparator and to inhibit the output train of pulses from passing through the gate to the phase comparator during the second pulse.

6. A circuit, comprising:

a receiver for receiving an input train of pulses;

a pulse generating circuit coupled to an output of the receiver for producing a first pulse in response to a leading edge of each one of the pulses in the input train of pulses and a second pulse in response to a trailing edge of each one of the pulses in the input train of pulses, the leading edges of the first and second pulses having the same edge type;

a variable delay line responsive to the first and second pulses for producing corresponding first and second output pulses, each one of said first and second output pulses being produced in response to the corresponding one of the first and second pulses after a time delay selected in accordance with a control signal fed to the variable delay line;

a phase comparator having a first input fed by one of the first and second pulses and a second input fed by the corresponding one of the first and second output pulses, for producing the control signal, said control signal selecting the time delay for the variable delay line to produce the output pulses with the leading edges timed coincident with leading edges of the pulses in the input train of pulses.

7. The circuit recited in claim 6 including:

a logic network for enabling only one of the first and second pulses to pass from the receiver to the delay line until the phase comparator provides an indication that the output train of pulses have leading edges timed coincident with leading edges of the input train of pulses.

8. The circuit recited in claim 7 wherein the phase comparator includes a first input fed by pulses in the output train of pulses and a second input fed by pulses in the received train of input pulses and including:

a gate fed by the output train of pulses and a gating signal; and a gate pulse generator responsive to one of the first and second pulses for producing the gating signal during the first pulse to enable the output train of pulses to pass through said gate to the phase comparator and to inhibit the output train of pulses from passing through the gate to the phase comparator during the second pulse.

9. The circuit recited in claim 6 wherein the phase comparator includes a first input fed by pulses in the output train of pulses and a second input fed by pulses in the received train of input pulses and including:

a gate fed by the output train of pulses and a gating signal; and a gate pulse generator responsive to one of the first and second pulses for producing the gating signal during the first pulse to enable the output train of pulses to pass through said gate to the phase comparator and to inhibit the output train of pulses from passing through the gate to the phase comparator during the second pulse.

10. A circuit, comprising:

a receiver for receiving an input train of pulses, said train of pulses having a period, T, said receiver providing a first time delay, $\Delta_1$ to the pulses in the input train of pulses;

a pulse generating circuit coupled to an output of the receiver for producing a first pulse in response to a leading edge of each one of the pulses in the input train of pulses and a second pulse in response to a trailing edge of each one of the pulses in the input train of pulses, the leading edges of the first and second pulses having the same edge type, said pulse generating circuit producing the first pulses and the second pulses with a second time delay $\Delta_2$ after the leading edge of pulses in the input train of pulses;

a logic network for combining the first pulses and the second pulses into a composite input signal comprising the first and second pulses with the leading edge of the first pulse maintaining the same edge type, said logic network providing a third time delay $\Delta_3$ to the first and second pulses;

a variable delay line responsive to the first and second pulses for producing corresponding first and second output pulses, each one of said first and second output pulses being produced in response to the corresponding one of the first and second pulses after a time delay $\Delta_L$ selected in accordance with a control signal fed to the variable delay line;

a delay network fed by the output train of pulses said delay network providing a fourth time delay $\Delta_4$ related to $\Delta_1+\Delta_2$;

a phase comparator having a first input fed by one of the first and second pulses and a second input coupled to an output of the delay network, for producing the control signal, said control signal selecting the time delay $\Delta_L$ equal to $nT-(\Delta_1+\Delta_2+\Delta_3)$, where n is an integer to produce the output pulses having leading edges timed coincident with leading edges of the pulses in the input train of pulses.

11. The circuit recited in claim 10 wherein the phase comparator includes a first input fed by pulses in the output train of pulses and a second input fed by pulses in the received train of input pulses and including:

a gate fed by the output train of pulses and a gating signal; and a gate pulse generator responsive to one of the first and second pulses for producing the gating signal during the first pulse to enable the output train of pulses to pass through said gate to the phase comparator and to inhibit the output train of pulses from passing through the gate to the phase comparator during the second pulse.

12. A method for generating a train of output pulses having a predetermined phase relationship with a train of input pulses, comprising:

passing the input train of pulses through a receiver;

producing a first pulse in response to a leading edge of each the received input train of pulses and a second pulse in response to a trailing edge of each one of the received input train of pulses, each one of the first and second pulses having leading edges with the same edge type;

feeding the first and second pulses through a delay line to produce the output train of pulses.

13. The method recited in claim 12 wherein the producing step includes producing a control signal for the variable delay line in response to a time difference between pulses in the output train of pulses and pulses in the received train of input pulses.

14. The method recited in claim 13 wherein the producing step comprises enabling only one of the first and second pulses to pass from the receiver to the delay line until an indication is provided that the output train of pulses have leading edges timed coincident with the leading edges of the input train of pulses.

* * * * *